United States Patent
Yuan et al.

(10) Patent No.: US 11,393,402 B2
(45) Date of Patent: Jul. 19, 2022

(54) OR LOGIC OPERATION CIRCUIT AND DRIVING METHOD, SHIFT REGISTER UNIT, GATE DRIVE CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN); Meng Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 380 days.

(21) Appl. No.: 16/611,295

(22) PCT Filed: Jan. 16, 2019

(86) PCT No.: PCT/CN2019/072012
§ 371 (c)(1),
(2) Date: Nov. 6, 2019

(87) PCT Pub. No.: WO2019/227950
PCT Pub. Date: Dec. 5, 2019

(65) Prior Publication Data
US 2021/0335200 A1 Oct. 28, 2021

(30) Foreign Application Priority Data
May 30, 2018 (CN) .......................... 201810541980.4

(51) Int. Cl.
*G09G 3/3266* (2016.01)
*G09G 3/36* (2006.01)
(Continued)

(52) U.S. Cl.
CPC ......... *G09G 3/3266* (2013.01); *G09G 3/2092* (2013.01); *G09G 3/3677* (2013.01);
(Continued)

(58) Field of Classification Search
CPC ............... G09G 3/3266; G09G 3/3677; G09G 2310/0286; G11C 19/28; H03K 19/018521; H03K 19/20
See application file for complete search history.

(56) References Cited

U.S. PATENT DOCUMENTS 7,456,660 B2* 11/2008 Kurokawa ........ H01L 29/78621
326/114
7,852,309 B2 12/2010 Chung
(Continued)

FOREIGN PATENT DOCUMENTS

| CN | 1612345 A | 5/2005 |
|---|---|---|
| CN | 1909040 A | 2/2007 |

(Continued)

OTHER PUBLICATIONS

Second Chinese Office Action Application No. 201810541980.4; dated Apr. 20, 2020.
(Continued)

*Primary Examiner* — Patrick O Neill

(57) ABSTRACT

An OR logic operation circuit and a driving method, a shift register unit, a gate drive circuit, and a display device are provided. The OR logic operation circuit includes: a first
(Continued)

inverter, a second inverter, a first control circuit, and a second control circuit. The first inverter is configured to invert a first control signal, which is received, to output a second control signal; the second inverter is configured to invert a third control signal received to output a fourth control signal; the first control circuit is configured to perform first control on a first node and the output terminal to achieve an OR operation and output a first level of an output signal at the output terminal; and the second control circuit is configured to perform second control on the first node and the output terminal to output a second level of the output signal at the output terminal.

19 Claims, 5 Drawing Sheets

(51) Int. Cl.
    *G11C 19/28*     (2006.01)
    *H03K 19/20*     (2006.01)
    *G09G 3/20*     (2006.01)
    *H03K 19/0185*     (2006.01)

(52) U.S. Cl.
    CPC ..... *G11C 19/28* (2013.01); *H03K 19/018521* (2013.01); *H03K 19/20* (2013.01); *G09G 2310/0286* (2013.01)

(56) References Cited

U.S. PATENT DOCUMENTS

| | | | | |
|---|---|---|---|---|
| 8,013,633 | B2 * | 9/2011 | Luo | ................. H03K 19/09441 |
| | | | | 326/83 |
| 9,325,315 | B2 * | 4/2016 | Wu | ........................ H03K 19/20 |
| 9,805,679 | B2 * | 10/2017 | Dai | ..................... H01L 27/1225 |
| 10,027,329 | B2 * | 7/2018 | Wu | ..................... H01L 27/1255 |

FOREIGN PATENT DOCUMENTS

| | | |
|---|---|---|
| CN | 1917016 A | 2/2007 |
| CN | 103560782 A | 2/2014 |
| CN | 104575424 A | 4/2015 |
| CN | 104575425 A | 4/2015 |
| CN | 104883181 A | 9/2015 |
| CN | 107424582 A | 12/2017 |
| CN | 107507556 A | 12/2017 |
| CN | 107634755 A | 1/2018 |
| CN | 108735163 A | 11/2018 |
| EP | 0101896 A2 | 3/1984 |
| JP | 2009188749 A | 8/2009 |
| KR | 1020070001736 A | 1/2007 |

OTHER PUBLICATIONS

The First Chinese Office Action dated Sep. 4, 2019; Appln. No. 201810541980.4.

* cited by examiner

ОR LOGIC OPERATION CIRCUIT AND DRIVING METHOD, SHIFT REGISTER UNIT, GATE DRIVE CIRCUIT, AND DISPLAY DEVICE

The present application claims priority of Chinese Patent Application No. 201810541980.4, filed on May 30, 2018, the disclosure of which is incorporated herein by reference in its entirety as part of the present application.

TECHNICAL FIELD

The embodiments of the present disclosure relate to an OR logic operation circuit and a driving method, a shift register unit, a gate drive circuit, and a display device.

BACKGROUND

In a field of display technology, a pixel array of, for example, a liquid crystal display panel or an organic light emitting diode (OLED) display panel generally comprises a plurality of rows of gate lines and a plurality of columns of data lines, and the plurality of columns of data lines are interleaved with the plurality of rows of gate lines. The driving of the gate lines can be achieved by a gate drive circuit. The gate drive circuit is typically integrated in a gate driver chip (Gate IC). In IC design, an area of a chip is a main factor affecting the cost of the chip, and how to effectively reduce the area of the chip is a problem that technology developers need to consider.

SUMMARY

At least one embodiment of the present disclosure provides an OR logic operation circuit, and the OR logic operation circuit comprises a first inverter, a second inverter, a first control circuit, and a second control circuit. The first inverter is configured to invert a first control signal, which is received, to output a second control signal; the second inverter is configured to invert a third control signal received to output a fourth control signal; the first control circuit is connected to the first inverter, the second inverter, and an output terminal, and is configured to perform first control on a first node and the output terminal to achieve an OR operation under control of the second control signal and the fourth control signal and to output a first level of an output signal at the output terminal; the second control circuit is connected to the output terminal, and is configured to perform second control on the first node and the output terminal to output a second level of the output signal at the output terminal.

For example, in the OR logic operation circuit provided by an embodiment of the present disclosure, the second control circuit comprises a first transistor, a second transistor, and a first capacitor. A first terminal of the first transistor is connected to a control terminal of the first transistor, and is connected to a first voltage terminal to receive a first voltage; a first terminal of the second transistor is connected to the first voltage terminal to receive the first voltage, a control terminal of the second transistor is connected to a second terminal of the first transistor and the first node; one terminal of the first capacitor is connected to the first node, and another terminal of the first capacitor is connected to a second terminal of the second transistor and the output terminal.

For example, in the OR logic operation circuit provided by an embodiment of the present disclosure, the first control circuit comprises a third transistor, a fourth transistor, a fifth transistor, and a sixth transistor. A first terminal of the third transistor is connected to the first node, and a control terminal of the third transistor is connected to a third node to receive the fourth control signal; a first terminal of the fourth transistor is connected to a second terminal of the third transistor, a control terminal of the fourth transistor is connected to a second node to receive the second control signal, and a second terminal of the fourth transistor is connected to a second voltage terminal to receive a second voltage; a first terminal of the fifth transistor is connected to the output terminal, and a control terminal of the fifth transistor is connected to the control terminal of the third transistor; a first terminal of the sixth transistor is connected to a second terminal of the fifth transistor, a control terminal of the sixth transistor is connected to the control terminal of the fourth transistor, and a second terminal of the sixth transistor is connected to the second voltage terminal to receive the second voltage.

For example, in the OR logic operation circuit provided by an embodiment of the present disclosure, the first transistor to the sixth transistor all are depletion mode transistors.

For example, in the OR logic operation circuit provided by an embodiment of the present disclosure, the first inverter comprises a seventh transistor and an eighth transistor. A first terminal of the seventh transistor is connected to a control terminal of the seventh transistor, and is connected to a first voltage terminal to receive a first voltage; a first terminal of the eighth transistor is connected to a second terminal of the seventh transistor and a second node, a control terminal of the eighth transistor, as an input terminal of the first inverter, receives the first control signal, and a second terminal of the eighth transistor is connected to a second voltage terminal to receive a second voltage; and the second node serves as an output terminal of the first inverter.

For example, in the OR logic operation circuit provided by an embodiment of the present disclosure, the second inverter comprises a ninth transistor and a tenth transistor. A first terminal of the ninth transistor is connected to a control terminal of the ninth transistor, and is connected to a first voltage terminal to receive a first voltage; a first terminal of the tenth transistor is connected to a second terminal of the ninth transistor and a third node, and a control terminal of the tenth transistor, as an input terminal of the second inverter, receives the third control signal, and a second terminal of the tenth transistor is connected to a second voltage terminal to receive a second voltage; and the third node serves as an output terminal of the second inverter.

At least one embodiment of the present disclosure further provides a shift register unit, and the shift register unit comprises a first shift register sub-unit, a second shift register sub-unit, and the OR logic operation circuit according to any one of the embodiments of the present disclosure. The first shift register sub-unit is connected to the first inverter of the OR logic operation circuit, and the second shift register sub-unit is connected to the second inverter of the OR logic operation circuit.

For example, in the shift register unit provided by an embodiment of the present disclosure, the first shift register sub-unit comprises a first input circuit, a first output circuit, and a first noise reduction circuit. The first input circuit is connected to a first control node, and is configured to control a level of the first control node, in response to a first input signal, to obtain the first control signal; the first output circuit is connected to the first control node and a first shift output terminal, and is configured to output a first shift output signal at the first shift output terminal under control of the first control signal; and the first noise reduction circuit is connected to the first control node, a second control node, and the first shift output terminal, and is configured to perform noise reduction on the first shift output terminal and the first control node in response to a level of the second control node.

For example, in the shift register unit provided by an embodiment of the present disclosure, the first inverter is further configured to control the level of the second control node, in response to the first control signal, to obtain the second control signal.

For example, in the shift register unit provided by an embodiment of the present disclosure, the first shift register sub-unit further comprises a first inverting circuit, and the first inverting circuit is configured to control the level of the second control node, in response to the first control signal, to obtain the second control signal.

For example, in the shift register unit provided by an embodiment of the present disclosure, the second shift register sub-unit comprises a second input circuit, a second output circuit, and a second noise reduction circuit. The second input circuit is connected to a third control node, and is configured to control a level of the third control node, in response to a second input signal, to obtain the third control signal; the second output circuit is connected to the third control node and a second shift output terminal, and is configured to output a second shift output signal at the second shift output terminal under control of the third control signal; and the second noise reduction circuit is connected to the third control node, a fourth control node, and the second shift output terminal, and is configured to perform noise reduction on the second shift output terminal and the third control node in response to a level of the fourth control node.

For example, in the shift register unit provided by an embodiment of the present disclosure, the second inverter is configured to control the level of the fourth control node, in response to the third control signal, to obtain the fourth control signal.

For example, in the shift register unit provided by an embodiment of the present disclosure, the second shift register sub-unit further comprises a second inverting circuit, and the second inverting circuit is configured to control the level of the fourth control node, in response to the third control signal, to obtain the fourth control signal.

At least one embodiment of the present disclosure further provides a gate drive circuit, comprising a plurality of cascaded shift register units according to any one of the embodiments of the present disclosure.

For example, the gate drive circuit provided by an embodiment of the present disclosure further comprises a first gate drive sub-circuit and a second gate drive sub-circuit. The first gate drive sub-circuit comprises a plurality of cascaded first shift register sub-units, and the second gate drive sub-circuit comprises a plurality of cascaded second shift register sub-units.

For example, in the gate drive circuit provided by an embodiment of the present disclosure, except for a first stage of first shift register sub-unit, a first input terminal of each stage of first shift register sub-unit other than the first stage of first shift register sub-unit is connected to a first shift output terminal of a previous stage of first shift register sub-unit; and except for a first stage of second shift register sub-unit, a second input terminal of each stage of second shift register sub-unit other than the first stage of second shift register sub-unit is connected to a second shift output terminal of a previous stage of second shift register sub-unit.

At least one embodiment of the present disclosure further provides a display device, comprising the gate drive circuit according to any one of the embodiments of the present disclosure.

At least one embodiment of the present disclosure further provides a driving method of an OR logic operation circuit, comprising: in a case where the first control signal and the third control signal are both at a first level, outputting the first level of the output signal at the output terminal; and in a case where at least one of the first control signal and the third control signal is at a second level, outputting the second level of the output signal at the output terminal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
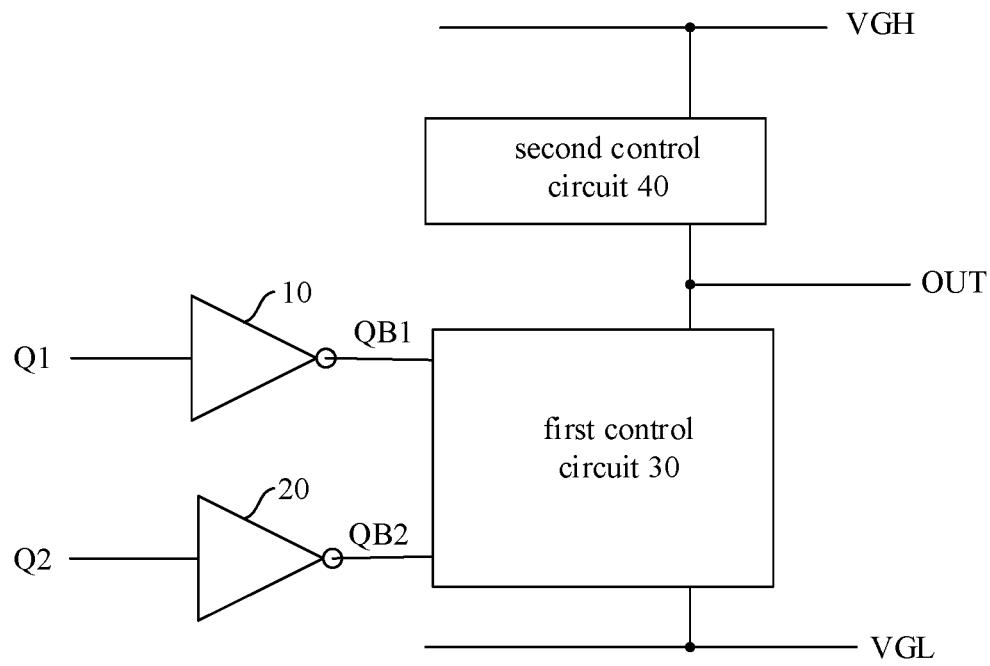
FIG. 1 is a block schematic diagram of an OR logic operation circuit according to some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an,"

etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the absolute position of the object which is described is changed, the relative position relationship may be changed accordingly.

The embodiments of the present disclosure are described in detail below, and the examples of the embodiments are illustrated in the accompanying drawings, in order to enable the following description of the embodiments of the present disclosure clear and concise, the present disclosure omits detailed description of known functions and known components, and the same or similar reference numerals indicate the same or similar elements or elements having the same or similar functions. The embodiments described below with reference to the drawings are exemplary, are intended to illustrate the present disclosure, and are not to be construed as limiting the present disclosure.

For example, in an OLED (Organic Light-Emitting Diode) display panel, according to actual needs, a drive circuit (for example, a gate drive circuit) of a display device needs to add a drive circuit related to compensation, and a traditional GOA (Gate On Array) unit is no longer satisfied with the needs of a display function, for example, in some applications, a logic operation circuit (such as an OR logic operation circuit) needs to be added to implement some other functions, such as outputting composite pulses and the like.

However, in some related technologies, an OR logic operation circuit of a GOA unit is generally implemented by adopting an oxide back plate, because negative drift of a threshold voltage of a thin film transistor comprised in the oxide back plate is prone to occur in a case where the threshold voltage is under stress of long-term negative voltage, therefore, a function of a circuit is invalid, moreover, a structure of the oxide back plate not only has high cost, but also the circuit structure is complicated, which is not conducive to mass production of products.

An embodiment of the present disclosure provides an OR logic operation circuit, and the OR logic operation circuit comprises a first inverter, a second inverter, a first control circuit, and a second control circuit. The first inverter is configured to invert a first control signal, which is received, to output a second control signal; the second inverter is configured to invert a third control signal received to output a fourth control signal; the first control circuit is configured to perform first control on a first node and the output terminal to achieve an OR operation under control of the second control signal and the fourth control signal and to output a first level of an output signal at the output terminal; and the second control circuit is configured to perform second control on the first node and the output terminal to output a second level of the output signal at the output terminal.

At least one embodiment of the present disclosure also provides a shift register unit, a gate drive circuit, a display device, a display screen, and a driving method corresponding to the above OR logic operation circuit.

The OR logic operation circuit provided by the above embodiments of the present disclosure is not only simple in structure but also low in cost, thereby being advantageous to achieve mass production of products.

The OR logic operation circuit, the shift register unit, the gate drive circuit, the display device, and the display screen provided by the embodiments of the present disclosure are described below with reference to the accompanying drawings.

FIG. 1 is a block schematic diagram of an OR logic operation circuit according to some embodiments of the present disclosure. For example, the OR logic operation circuit can be applied to a shift register unit to control an OR logic operation of outputs of a plurality of sub-units in the shift register unit, so that the shift register unit can output a composite pules, for example, the composite pulse can be used for display and sensing of a pixel circuit. For example, the shift register unit may comprise a first shift register sub-unit and a second shift register sub-unit, and a specific structure of the shift register unit will be described in detail below and will not be described herein. As shown in FIG. 1, the OR logic operation circuit comprises a first inverter 10, a second inverter 20, a first control circuit 30, and a second control circuit 40.

The first inverter 10 is configured to invert a first control signal, which is received, to output a second control signal. For example, the first control signal is an input signal of the first inverter 10. For example, in an example, the first control signal may be a level at a first control node Q1 of the first shift register sub-unit. For example, the second control signal is an output signal of the first inverter 10. For example, in an example, the second control signal may be a level at a second control node QB1 of the first shift register sub-unit.

The second inverter 20 is configured to invert a third control signal, which is received, to output a fourth control signal. For example, the third control signal is an input signal of the second inverter 20. For example, in an example, the third control signal may be a level at a third control node Q2 of the second shift register sub-unit. For example, the fourth control signal is an output signal of the second inverter 20. For example, in an example, the fourth control signal is a level at a fourth control node QB2 of the second shift register sub-unit.

The first control circuit is configured to perform first control on a first node (not shown in figures) and the output terminal OUT to achieve an OR operation, under control of the second control signal QB1 and the fourth control signal QB2, and to output a first level (such as, a low level) of an output signal at the output terminal OUT. For example, the first control may be a pull-down control (that is, discharge). For example, in an example, the first control circuit 30 is connected to the second control node QB1, the fourth control node QB2, the first node, the output terminal OUT, and a second voltage terminal VGL, in a case where the second control signal QB1 and the fourth control signal QB2 are simultaneously at a high level, that is, in a case where the first control signal Q1 and the third control signal Q2 are simultaneously at a low level, the first control circuit 30 is turned on under control of the second control signal QB1 and the fourth control signal QB2, such that the first node and the output terminal OUT are connected to the second voltage terminal VGL to receive a second voltage (such as, a low level), thereby outputting a low level at the output terminal; and in a case where at least one of the second control signal QB1 and the fourth control signal QB2 is at a low level, that is, in a case where at least one of the first control signal Q1 and the third control signal Q2 is at a high level, the first control circuit 30 is turned off under control of the second control signal QB1 and the fourth control signal QB2, such that the first node and the output terminal OUT are connected to the first voltage terminal VGH to receive a first voltage (such as, a high level) under control of the first control circuit 40, thereby outputting a high level at the output terminal OUT, so that, an OR logic operation can be achieved according to the level of the first control signal Q1 and the level of the third control signal Q2.

For example, the output signal can be output to pixel circuits of a display panel through gate lines, so that display or sensing of the pixel circuits can be controlled line by line.

The second control circuit 40 is configured to perform second control on the first node and the output terminal OUT to output a second level (such as, a high level) of the output signal at the output terminal OUT. For example, the second control circuit 40 is connected to the first node, the output terminal OUT, and the first voltage terminal VGH, and is turned on under control of the first voltage provided by the first voltage terminal VGH to output the first voltage to the output terminal OUT. For example, the second control may comprise a pull-up process on the output signal.

The OR logic operation circuit provided by the above embodiments of the present disclosure is not only simple in structure but also low in cost, thereby being advantageous to achieve mass production of products.

Figure 2:
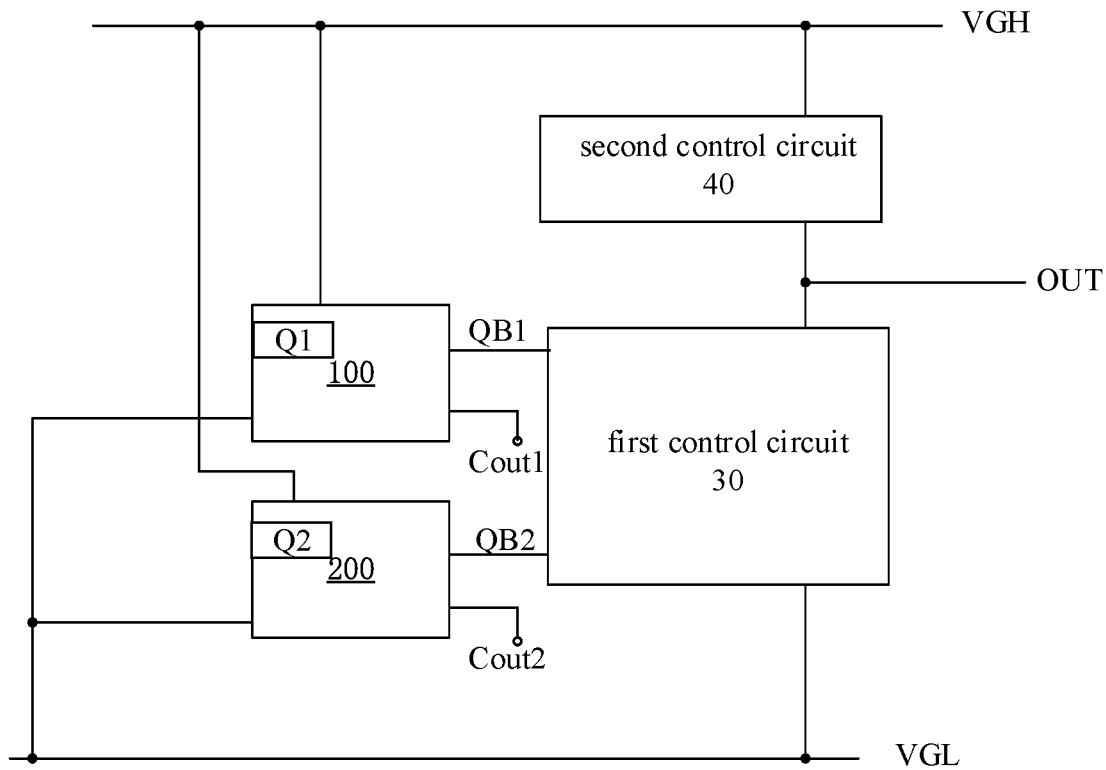
FIG. 2 is a block schematic diagram of a shift register unit according to some embodiments of the present disclosure.

At least one embodiment of the present disclosure also provides a shift register unit. For example, the shift register unit is a row drive unit of an array substrate. As shown in FIG. 2, the shift register unit comprises a first shift register sub-unit 100, a second shift register sub-unit 200, and the OR logic operation circuit provided by the above embodiment of the present disclosure. For example, the first shift register sub-unit 100 is connected to the first inverter 10 of the OR logic operation circuit, and the second shift register sub-unit 200 is connected to the second inverter 20 of the OR logic operation circuit. For example, the shift register unit can output a composite pulse.

Figure 5:
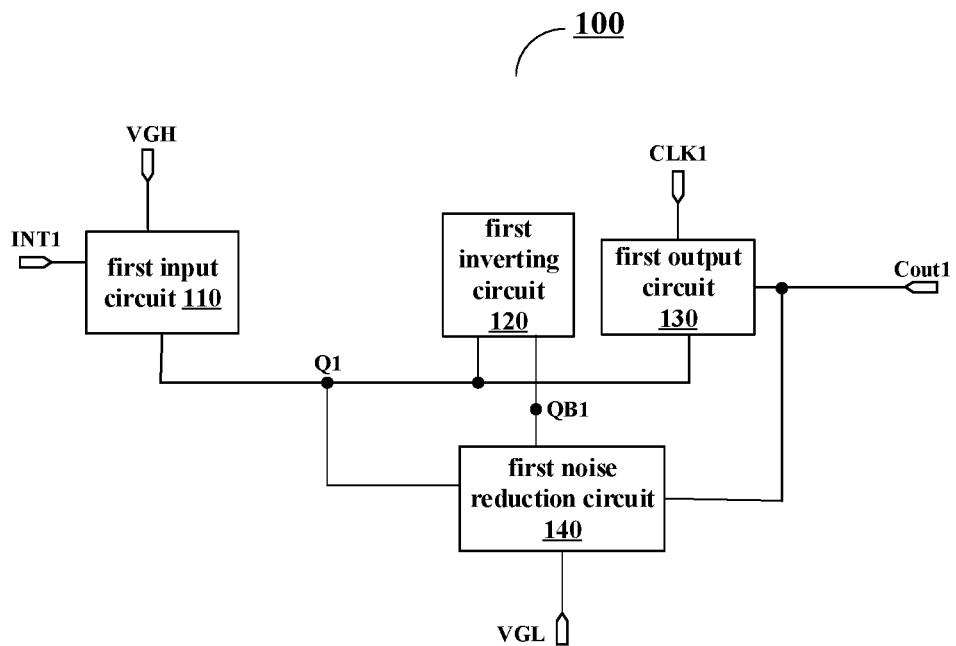
FIG. 5 is a schematic diagram of a first shift register sub-unit according to some embodiments of the present disclosure.

For example, as shown in FIG. 5, in an example, the first shift register sub-unit 100 comprises a first input circuit 110, a first output circuit 130, and a first noise reduction circuit 140.

The first input circuit 110 is connected to the first control node Q1, and is configured to control a level of the first control node Q1, in response to a first input signal, to obtain the first control signal. For example, the first input circuit 110 is connected to a first input terminal INT1, a first voltage terminal VGH, and the first control node Q1, and is configured to electrically connect the first control node Q1 and the first voltage terminal VGH under control of the first input signal input by the first input terminal INT1, so that the first voltage (such as, a high level signal) input by the first voltage terminal VGH can perform control (e.g., charge) on the first control node Q1, so that the voltage of the first control node Q1 can be increased to control the first output circuit 130 to be turned on. It should be noted that, the present disclosure is not limited thereto, the first input circuit 110 may be connected only to the first input terminal INT1 and the first control node Q1, and is configured to electrically connect the first control node Q1 and the first input terminal INT1 under control of a signal input by the first input terminal INT1, so that a high level signal input by the first input terminal INT1 can charge the first control node Q1.

The first output circuit 130 is configured to be connected to the first control node Q1 and a first shift output terminal Cout1, and is configured to output a first shift output signal at the first shift output terminal Cout1 under control of the first control signal. For example, the first output circuit 130 is connected to the first control node Q1, a first clock signal terminal CLK1, and the first shift output terminal Cout1, and is configured to be turned on under control of a level of the first control node Q1, so as to electrically connect the first clock signal terminal CLK1 and the first shift output terminal Cout1, so that a clock signal input by the first clock signal terminal CLK1 can be output to the first shift output terminal Cout1 as the output signal.

The first noise reduction circuit 140 is connected to the first control node Q1, the second control node QB1, and the first shift output terminal Cout1, and is configured to perform noise reduction on the first shift output terminal Cout1 and the first control node Q1 in response to the second control signal QB1. For example, the first noise reduction circuit 140 is connected to the first control node Q1, the first shift output terminal Cout1, the second control node QB1, and the second voltage terminal VGL, and electrically connect the first control node Q1 and the first shift output terminal Cout1 with the second voltage terminal VGL under control of the level of the second control node QB1, thereby performing pull-down noise reduction on the first control node Q1 and the first shift output terminal Cout1.

For example, in this example, the first inverter 10 is further configured to control a level of the second control node QB1, in response to the first control signal, to obtain the second control signal, that is, the first inverter 10 may be multiplexed to connect the first control node Q1 and the second control node QB1 in the first shift register sub-unit 100 such that the level of the second control node QB1 (that is, the second control signal) is opposite to the level of the first control node Q1 (that is, the first control signal), thereby controlling the normal output of the first shift register sub-unit 100.

For example, as shown in FIG. 5, in another example, the first shift register sub-unit 100 further comprises a first inverting circuit 120. The first inverting circuit 120 is configured to control a level of the second control node QB1, in response to the first control signal Q1, to obtain the second control signal. For example, the first inverting circuit 120 is connected to the first control node Q1 and the second control node QB1, and is configured to pull down the second control node QB1 to a low level in a case where the first control node Q1 is at a high level, and pull up the second control node QB1 to a high level in a case where the first control node Q1 is at a low level. For example, a structure of the first inverting circuit 120 may be similar to a structure of the first inverter 10 or a structure of the second inverter 20, and the first inverting circuit 120 may be any circuit in the art that can implement an inverting function, and details are not described herein again.

For example, in this example, the first inverting circuit 120 and the first inverter 10 both are provided, the first inverting circuit 120 is used to control the normal output of the first shift register sub-unit 100, and the first inverter 10 is used for controlling a normal operation of the OR logic operation circuit.

Figure 6:
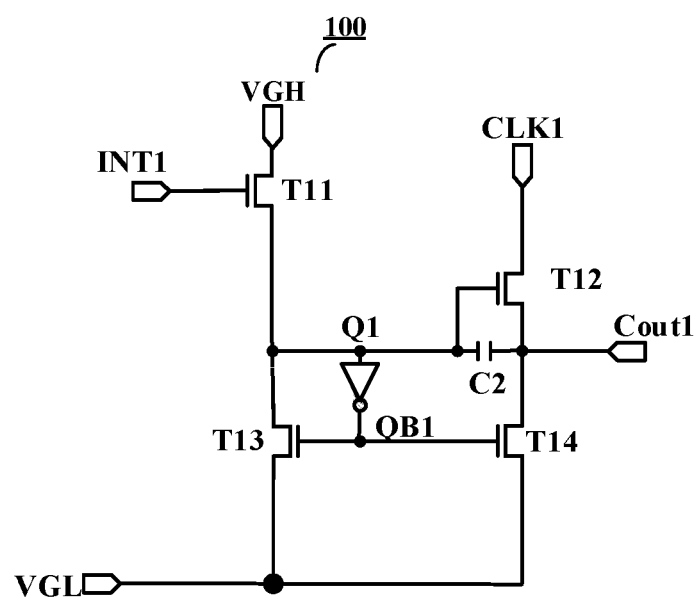
FIG. 6 is a circuit schematic diagram of a specific implementation example of the first shift register sub-unit as shown in FIG. 5.

For example, in an example, the first shift register sub-circuit 100 as shown in FIG. 5 can be specifically implemented as a circuit structure as shown in FIG. 6. In the following description, a case that each transistor is an N-type transistor is taken as an example to be described, but this case does not constitute a limitations on the embodiments of the present disclosure. For example, the N-type transistor is turned on in response to a high-level signal and is turned off in response to a low-level signal, and the following embodiments are the same as those described herein, and similar description will be omitted.

The first input circuit 110 can be implemented as an eleventh transistor T11. A gate electrode of the eleventh transistor T11 is electrically connected to the first input terminal INT1 to receive the first input signal, a first electrode of the eleventh transistor T11 is connected to the first voltage terminal VGH to receive the first voltage, and a second electrode of the eleventh transistor T11 is configured to be connected to the first control node Q1, so that in a case where the eleventh transistor T11 is turned on due to a turn-on signal (a high level signal) received by the first input terminal INT1, the first control node Q1 and the second voltage terminal VGH are electrically connected, so as to charge the first control node Q1 and enable the first control node Q1 be at a high level.

The first output circuit 130 can be implemented to comprise a twelfth transistor T12 and a second storage capacitor C2. A gate electrode of the twelfth transistor T12 is configured to be connected to the first control node Q1, a first electrode of the twelfth transistor T12 is configured to be connected to the first clock signal terminal CLK1 to receive a first clock signal, and a second electrode of the twelfth transistor T12 is configured to be connected to the first shift output terminal Cout1; and a first electrode of the second storage capacitor C2 is configured to be connected to the gate electrode of the twelfth transistor T12, and a second electrode of the second storage capacitor C2 is connected to the second electrode of the twelfth transistor T12.

The first noise reduction circuit 140 can be implemented as a thirteenth transistor T13 and a fourteenth transistor T14. A gate electrode of the thirteenth transistor T13 is configured to be connected to the second control node QB1, a first electrode of the thirteenth transistor T13 is configured to be connected to the first control node Q1, and a second electrode of the thirteenth transistor T13 is configured to be connected to the second voltage terminal VGL to receive the second voltage. The thirteenth transistor T13 is turned on in a case where the second control node QB1 is at a high potential, so as to connect the first control node Q1 and the second voltage terminal VGL, and therefore, the first control node Q1 can be pulled down to achieve noise reduction; and a gate electrode of the fourteenth transistor T14 is configured to be connected to the second control node QB1, a first electrode of the fourteenth transistor T14 is configured to be connected to the first shift output terminal Cout1, and a second electrode of the fourteenth transistor T14 is configured to be connected to the second voltage terminal VGL to receive the second voltage. The fourteenth transistor T14 is turned on in a case where the second control node QB1 is at a high potential, so as to connect the first shift output terminal Cout1 and the second voltage terminal VGL, thereby performing noise reduction on the first shift output terminal Cout1.

It should be noted that, the first shift register sub-unit provided by the embodiments of the present disclosure is not limited to the structure as shown in FIG. 5 or FIG. 6, and may have any other structure that can implement shift output. For example, according to actual needs, the first shift register sub-unit may further comprise a first control node reset circuit and the like, and the embodiments of the present disclosure are not limited to this case.

Figure 7:
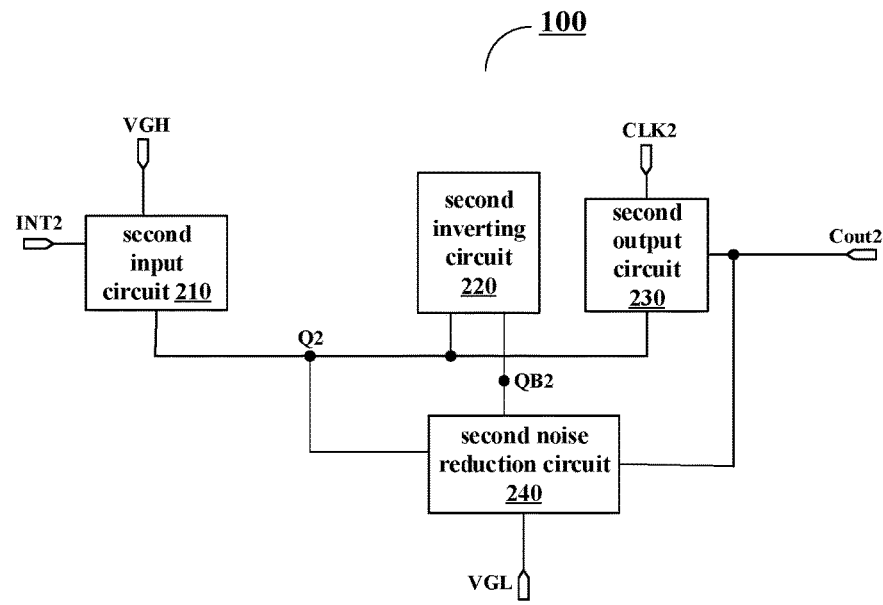
FIG. 7 is a schematic diagram of a second shift register sub-unit according to some embodiments of the present disclosure.

For example, as shown in FIG. 7, in an example, the second shift register sub-unit 200 comprises a second input circuit 210, a second output circuit 230, and a second noise reduction circuit 240.

The second input circuit 210 is connected to the third control node Q2 and is configured to control a level of the third control node Q2, in response to the second input signal, to obtain a third control signal.

The second output circuit 230 is connected to the third control node Q2 and a second shift output terminal Cout2, and is configured to output a second shift output signal at the second shift output terminal Cout2 under control of the third control signal.

The second noise reduction circuit 240 is connected to the third control node Q2, a fourth control node QB2, and the second shift output terminal Cout2, and is configured to perform noise reduction on the second shift output terminal Cout2 and the third control node Q2 in response to the fourth control signal.

For example, in this example, the second inverter 20 is further configured to control a level of the fourth control node QB2, in response to the third control signal, to obtain the fourth control signal, that is, the second inverter 20 may be multiplexed to connect the third control node Q2 and the fourth control node QB2 in the second shift register sub-unit 200 such that the level of the fourth control node QB2 (that is, the fourth control signal) is opposite to the level of the third control node Q2 (that is, the third control signal), thereby controlling the normal output of the second shift register sub-unit 200.

As shown in FIG. 7, in another example, the second shift register sub-unit 200 further comprises a second inverting circuit 220. The second inverting circuit 220 is configured to control the level of the fourth control node QB2, in response to the third control signal, to obtain the fourth control signal.

For example, in this example, the second inverting circuit 220 and the second inverter 20 both are provided, the second inverting circuit 220 is used to control the normal output of the second shift register sub-unit 200, and the second inverter 20 is used for controlling a normal operation of the OR logic operation circuit.

It should be noted that the specific implementation of the second shift register sub-unit 200 is similar to the structure of the first shift register sub-unit, and details are not described herein again.

For example, the first inverter 10 can be multiplexed with the first inverting circuit 120 of the first shift register sub-unit 100, and the second inverter 20 can be multiplexed with the second inverting circuit 220 of the second shift register sub-unit 200, so that the first control circuit 30 performs an OR operation according to the first control signal Q1 provided by the first shift register sub-unit 100 and the third control signal Q2 provided by the second shift register sub-unit 200. For example, the first control node Q1 of the first shift register sub-unit 100 is connected to the input terminal (such as Q1 as shown in FIG. 1) of the first inverter 10, the second control node QB1 is connected to the output terminal (such as QB1 as shown in FIG. 1) of the first inverter 10, the third control node Q2 of the second shift register sub-unit 200 is connected to the input terminal (such as Q2 as shown in FIG. 1) of the second inverter 20, and the fourth control node QB2 is connected to the output terminal (such as QB2 as shown in FIG. 1) of the second inverter 20.

Figure 3:
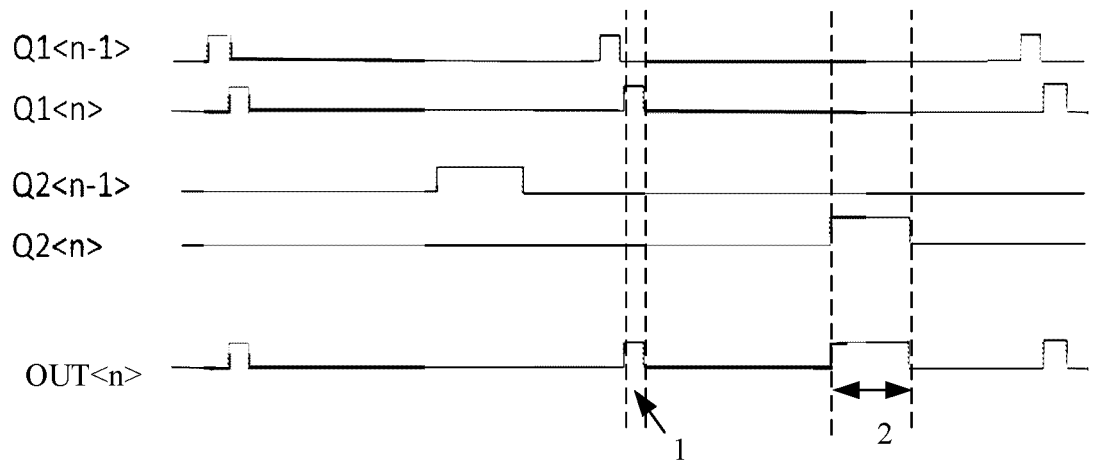
FIG. 3 is a timing diagram of a shift register unit according to some embodiments of the present disclosure.

Specifically, as shown in FIG. 1 and FIG. 2, the first voltage provided by the first voltage terminal VGH is a DC high voltage, for example, is about 20 to 30 V (volt), the second voltage provided by the second voltage terminal VGL is a DC low voltage, for example, the second voltage is lower than the first voltage, and is approximately −5V. For example, in an example, a GOA unit (that is, a shift register unit) comprises an inverting circuit, in the embodiment of the present disclosure, for example, at least one of the first inverting circuit 120 in the first shift register sub-unit 100 and the second inverting circuit 220 in the second shift register sub-unit 200 is multiplexed with one of the first inverter 10 and the second inverter 20. For example, in an example, as shown in FIG. 2, the first inverter 10 can be multiplexed with the first inverting circuit 120 in the first shift register sub-unit 100, the second inverter 20 can be multiplexed with the second inverting circuit 220 in the second shift register sub-unit 200, so that the architecture of the GOA unit can be simplified, the manufacturing cost of the display panel can be reduced, and a narrow frame design of the display panel can be achieved advantageously. As shown in FIG. 3, the first inverter 10 inverts the first control signal Q1 provided by the first shift register sub-unit 100 and outputs the second control signal QB1, and the second inverter 20 inverts the third control signal Q2 provided by the second shift register sub-unit 200 and outputs the fourth control signal QB2, and the second control circuit 40 can apply the first voltage VGH to the output terminal OUT in a case where the second control circuit 40 is turned on.

For example, a signal timing diagram of respective nodes in the shift register unit is shown in FIG. 3, and Q1<n−1> is a first control signal of a first shift register sub-unit in a (n−1)-th (n is an integer greater than 1) row, for example, is a level of a first node Q1 (for example, a pull-up node), Q1<n> is a first control signal of a first shift register sub-unit in an n-th row, Q2<n−1> is a third control signal of a second shift register sub-unit in the (n−1)-th row, and Q2<n> is a third control signal of a second shift register sub-unit in the n-th row.

For example, as shown in FIG. 3, in a first phase 1, a level (that is, the first control signal) at the first control node Q1<n> of the first shift register sub-unit in the n-th row is a high level, and therefore, an output terminal OUT<n> of a shift register unit 101 in the n-th row outputs a high level; and in a second phase 2, a level (that is, the third control signal) at the third control node Q2<n> of the second shift register sub-unit in the n-th row is a high level, and therefore, the output terminal OUT<n> of the shift register unit 101 in the n-th row outputs a high level. Therefore, as can be seen from FIG. 3, the circuit achieves the OR operation of the first shift register sub-unit and the second shift register sub-unit, and can output a composite pulse at the output terminal of the shift register unit. Thus, the OR operation of the first shift register sub-unit and the second shift register sub-unit can be achieved by the OR logic operation circuit, and the circuit is not only simple in structure but also low in cost, thereby being advantageous to achieve mass production of products.

Figure 4:
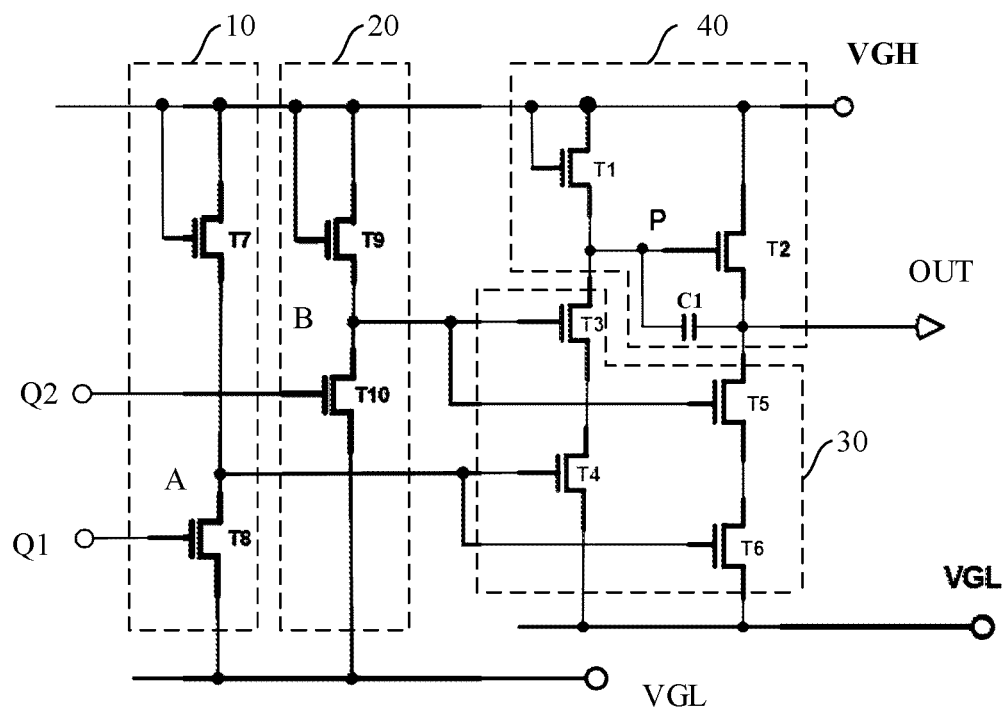
FIG. 4 is a circuit schematic diagram of a specific implementation example of the OR logic operation circuit as shown in FIG. 1.

A specific circuit structure of the OR logic operation circuit will be described below in conjunction with a specific example. FIG. 4 is a circuit diagram showing a specific implementation example of the OR logic operation circuit as shown in FIG. 1.

For example, as shown in FIG. 4, the second control circuit 40 may comprise: a first transistor T1, a second transistor T2, and a first capacitor C1. A first terminal of the first transistor T1 is connected to r a control terminal of the first transistor T1, and is connected to the first voltage terminal VGH to receive the first voltage. A first terminal of the second transistor T2 is connected to the first voltage terminal VGH to receive the first voltage, a control terminal of the second transistor T2 is connected to a second terminal of the first transistor T1 and a first node P. One terminal of the first capacitor C1 is connected to the first node P, and another terminal of the first capacitor C1 is connected to a second terminal of the second transistor T2 and the output terminal OUT.

As shown in FIG. 4, the first control circuit 30 may comprise: a third transistor T3, a fourth transistor T4, a fifth transistor T5, and a sixth transistor T6. A first terminal of the third transistor T3 is connected to the first node P, and a control terminal of the third transistor T3 is connected to a third node B to receive the fourth control signal QB2. A first terminal of the fourth transistor T4 is connected to a second terminal of the third transistor T3, a control terminal of the fourth transistor T4 is connected to a second node A to receive the second control signal QB1, and a second terminal of the fourth transistor T4 is connected to the second voltage terminal VGL to receive the second voltage. A first terminal of the fifth transistor T5 is connected to the output terminal OUT, and a control terminal of the fifth transistor T5 is connected to the control terminal of the third transistor T3. A first terminal of the sixth transistor T6 is connected to a second terminal of the fifth transistor T5, a control terminal of the sixth transistor T6 is connected to the control terminal of the fourth transistor T4, and a second terminal of the sixth transistor T6 is connected to the second voltage terminal VGL to receive the second voltage.

For example, as shown in FIG. 4, a leakage current can be effectively prevented from being generated at the first node P by adopting a double pull-down structure in the first control circuit.

Because transistors for implementing the second control circuit 40 are always in a turn-on state, for example, channel width to length ratios of the transistors of the first control circuit 30 and transistors for implementing the second control circuit 40 can be designed, such that in a case where the transistors for implementing the first control circuit 30 and the transistors for implementing the second control circuit 40 are all turned on, the first control node Q1 and the output terminal OUT are connected to the second voltage terminal VGL, thereby pulling down the level of the first control node Q1 and the level of the output terminal OUT.

In the embodiments of the present disclosure, the first transistor T1 to the sixth transistor T6 all may be depletion mode TFTs (thin film transistor), so as to achieve lossless output. The depletion mode TFTs can operate at a positive or negative gate-to-source voltage and substantially have no gate currents.

According to an embodiment of the present disclosure, as shown in FIG. 4, the first inverter 10 may comprise a seventh transistor T7 and an eighth transistor T8. A first terminal of the seventh transistor T7 is connected to a control terminal of the seventh transistor T7, and is connected to the first voltage terminal VGH to receive the first voltage; and a first terminal of the eighth transistor T8 is connected to a second terminal of the seventh transistor T7 and a second node A, a control terminal of the eighth transistor T8, as an input terminal of the first inverter 10, receives the first control signal Q1, and a second terminal of the eighth transistor T8 is connected to the second voltage terminal VGL to receive the second voltage, the second node A serves as an output terminal of the first inverter 10.

As shown in FIG. 4, the second inverter 20 may comprise a ninth transistor T9 and a tenth transistor T10. A first terminal of the ninth transistor T9 is connected to a control terminal of the ninth transistor T9, and is connected to the first voltage terminal VGH to receive the first voltage; and a first terminal of the tenth transistor T10 is connected to a second terminal of the ninth transistor T9 and a third node B, and a control terminal of the tenth transistor T10, as an input terminal of the second inverter 20, receives the third control signal Q2, and a second terminal of the tenth transistor T10 is connected to the second voltage terminal VGL to receive the second voltage; the third node B serves as an output terminal of the second inverter 20.

Specifically, as shown in FIG. 4, the first inverter 10 comprises a seventh transistor T7 and an eighth transistor T8, the second inverter 20 comprises a ninth transistor T9 and a tenth transistor T10, the first control circuit 30 comprises transistors T3, T4, T5, and T6, in a case where a potential of the second node A and a potential of the third node B are simultaneously high, the transistors T3, T4, T5, and T6 are simultaneously turned on, that is, the first control circuit 30 is turned on, so that the output terminal OUT is connected to the second voltage terminal VGL, and outputs the second voltage (for example, a low level) provided by the second voltage terminal VGL; and in other cases, because the transistors T1 and T2 constitutes a Darlington structure, the output is the first voltage (that is, a high level) provided by the first voltage terminal VGH, so that the circuit structure can implement the OR logic operation. In addition, a QB node (also known as a pull-down node) and a Q node (also known as a pull-up node) in a GOA are connected by an inverter, that is, in a practical application, the second node A may be the second control node QB1 of the first shift register sub-unit in an actual circuit, and the third node B may be the fourth control node QB2 of the second shift register sub-unit in the actual circuit.

In the embodiments of the present disclosure, for example, in a case where each circuit is implemented as N-type transistors, the term "pull-up" means charging a node or an electrode of a transistor such that an absolute value of a level of the node or the electrode is raised, thereby achieving an operation (such as, conduction) of a corresponding transistor; and the term "pull-down" means discharging a node or an electrode of a transistor such that an absolute value of a level of the node or the electrode is reduced, thereby achieving an operation (such as, turn off) of a corresponding transistor.

For another example, in a case where each circuit is implemented as P-type transistors, the term "pull-up" means discharging a node or an electrode of a transistor such that an absolute value of a level of the node or the electrode is reduced, thereby achieving an operation (such as, conduction) of a corresponding transistor; and the term "pull-down" means charging a node or an electrode of a transistor such that an absolute value of a level of the node or the electrode is raised, thereby achieving an operation (such as, turn off) of a corresponding transistor.

It should be noted that, in the description of various embodiments of the present disclosure, the first node P, the second node A, the third node B, the first control node Q1, the second control node QB1, and the third control node Q2, and the fourth control node QB2 do not represent actual components but represent junction nodes of relevant electrical connections in the circuit diagram.

It should be noted that, in the embodiments of the present disclosure, Q1 represents both the first control node and the first control signal; QB1 represents both the second control node and the second control signal; Q2 represents both the third control node and the third control signal; and QB2 represents both the fourth control node and the fourth control signal.

It should be noted that, in the embodiments of the present disclosure, the transistors can all be field effect transistors or other devices with the same characteristics, according to functions of respective transistors in the circuit, the transistors used in the embodiments of the present disclosure are mainly switching transistors. Because a source electrode and a drain electrode of a switching transistor used here are symmetrical, the source electrode and the drain electrode can be interchangeable. In the embodiments of the present disclosure, in order to distinguish two electrodes of the transistor except a gate electrode, the drain electrode is directly referred to as a first terminal, the source electrode is referred to as a second terminal, and the gate electrode of the transistor is referred to as a control terminal. In addition, the switching transistors used in the embodiments of the present disclosure may be N-type switching transistors. For example, the first inverter 10 and the second inverter 20 are not limited to the circuit configuration as shown in FIG. 4, and may be other circuit structures, as long as the inverting function of the GOA can be achieved.

In summary, according to the OR logic operation circuit of the embodiments of the present disclosure, the first control signal provided by the first shift register sub-unit is inverted by the first inverter to output the second control signal, the third control signal provided by the second shift register sub-unit is inverted by the second inverted to output the fourth control signal, the first control circuit performs the first control (for example, a pull-down process) on the second control signal and the fourth control signal to implement the OR operation, and outputs an output signal, and the second control circuit performs the second control (such as, a pull-up process) on the output signal. The circuit is not only simple in structure but also low in cost, thereby being advantageous to achieve mass production of products.

The present disclosure also provides a gate drive circuit, and the gate drive circuit comprises a plurality of cascaded shift register units 101 described above. For example, a structure of each of the plurality of shift register units 101 is shown in FIG. 2.

For example, the gate drive circuit 50 further comprises a first gate drive sub-circuit 501 and a second gate drive sub-circuit 502.

For example, the first gate drive sub-circuit 501 comprises a plurality of cascaded first shift register sub-units 100, and the second gate drive sub-circuit 502 comprises a plurality of cascaded second shift register sub-units 200.

For example, except for a first stage of first shift register sub-unit, a first input terminal INT1 of each stage of first shift register sub-unit other than the first stage of first shift register sub-unit is connected to a first shift output terminal Cout1 of a previous stage of first shift register sub-unit; and except for a first stage of second shift register sub-unit, a second input terminal INT2 of each stage of second shift register sub-unit other than the first stage of second shift register sub-unit is connected to a second shift output terminal Cout2 of a previous stage of second shift register sub-unit.

Except for a last stage of first shift register sub-unit, a reset terminal RST1 of each stage of first shift register sub-unit other than the last stage of first shift register sub-unit is connected to a first shift output terminal Cout1 of a next stage of first shift register sub-unit; except for a last stage of second shift register sub-unit, a reset terminal RST2 of each stage of second shift register sub-unit other than last stage of second shift register sub-unit is connected to a second shift output terminal Cout2 of a next stage of second shift register sub-unit.

For example, the output of the shift register unit 101 can be referred to the output as shown in FIG. 3, that is, the gate drive circuit can output a composite pulse.

Figure 8:
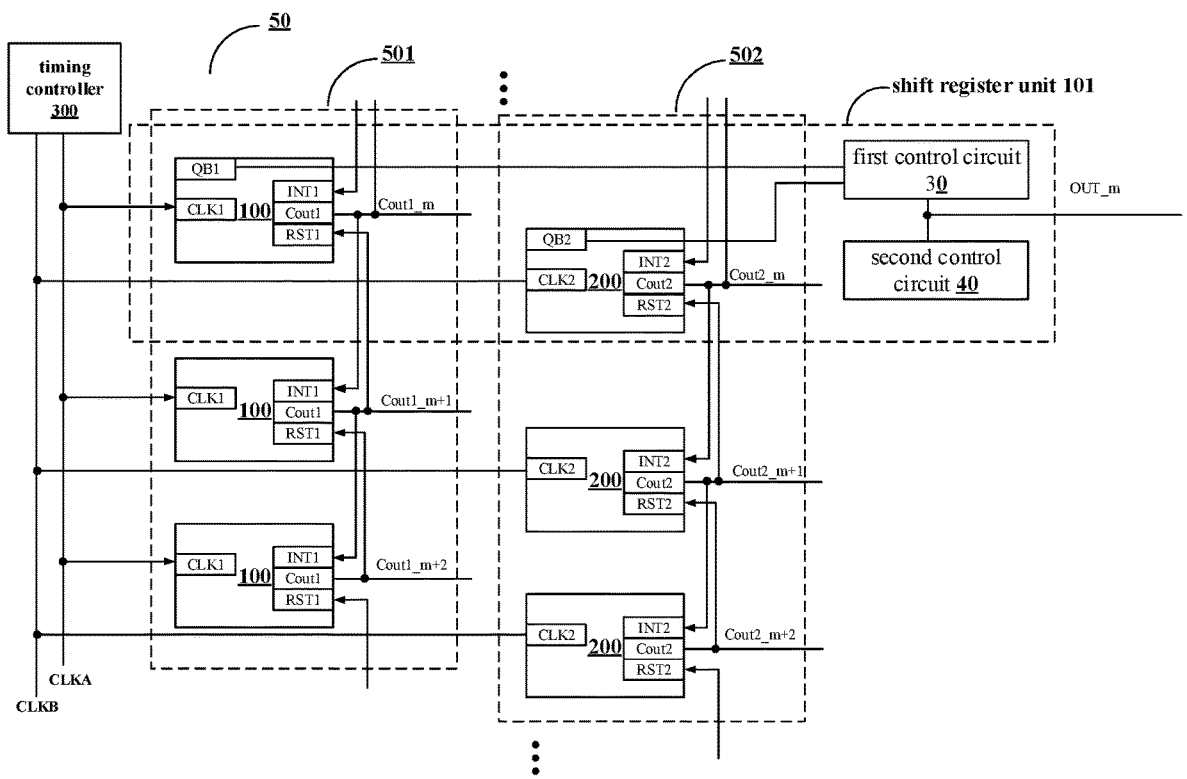
FIG. 8 is a schematic diagram of a gate drive circuit according to some embodiments of the present disclosure.

As shown in FIG. 8, the gate drive circuit 50 further comprises a first clock signal line CLKA and a second clock signal line CLKB. For example, the first clock signal line CLKA is respectively connected to first clock signal terminals CLK1 of the plurality of cascaded first shift register sub-units 100 to provide a clock signal, the second clock signal line CLKB is respectively connected to second clock signal terminals CLK2 of the plurality of cascaded second shift register sub-units 200 to provide a clock signal. It should be noted that, the gate drive circuit 50 may further comprise four, six, or eight and more clock signal lines. The amount of the clock signal lines is determined according to a specific situation, and the embodiments of the present disclosure are not limited thereto.

It should be noted that, OUT_m (m is an integer greater than 0) shown in FIG. 8 represents an output terminal of a m-th stage of shift register unit, Cout1_$m$ represents a first shift output terminal of a m-th stage of first shift register sub-unit, Cout1_$m$+1 represents a first shift output terminal of a (m+1)-th stage of first shift register sub-unit, Cout1_$m$+2 represents a first shift output terminal of a (m+2)-th stage of first shift register sub-unit, . . . , Cout2_$m$ represents a second shift output terminal of a m-th stage of second shift register sub-unit, Cout2_$m$+1 represents a second shift output terminal of a (m+1)-th stage of second shift register sub-unit, and Cout2_$m$+2 represents a second shift output terminal of a (m+2)-th stage of second shift register sub-unit. The reference numerals in the following embodiments are similar to those described herein, and repeated portions will be omitted.

For example, as shown in FIG. 8, the gate drive circuit 50 may further comprise a timing controller 300. For example, the timing controller 300 may be configured to be connected to the first clock signal line CLKA and the second clock signal line CLKB to provide a clock signal to each shift register sub-unit. For example, the timing controller 300 can also be configured to provide a trigger signal STV to the input terminal of the first stage of shift register sub-unit and provide a reset signal to the reset terminal of the last stage of shift register sub-unit.

It should be noted that, for clarity and conciseness, the figures only shows a structure of a complete shift register unit, and the remaining shift register units omit the first control circuit 30 and the second control circuit 40. In addition, the entire structure of the gate drive circuit is not described in this embodiment. In order to implement the necessary functions of the gate drive circuit, those skilled in the art can set other structures not shown according to a specific application scenario, and the embodiments of the present disclosure are not limited thereto.

The gate drive circuit provided by the embodiments of the present disclosure can achieve the OR operation of the first shift register sub-unit and the second shift register sub-unit through the OR logic operation circuit in the above-mentioned shift register unit, and is not only simple in structure but also low in cost, thereby being advantageous to achieve mass production of products.

Figure 9:
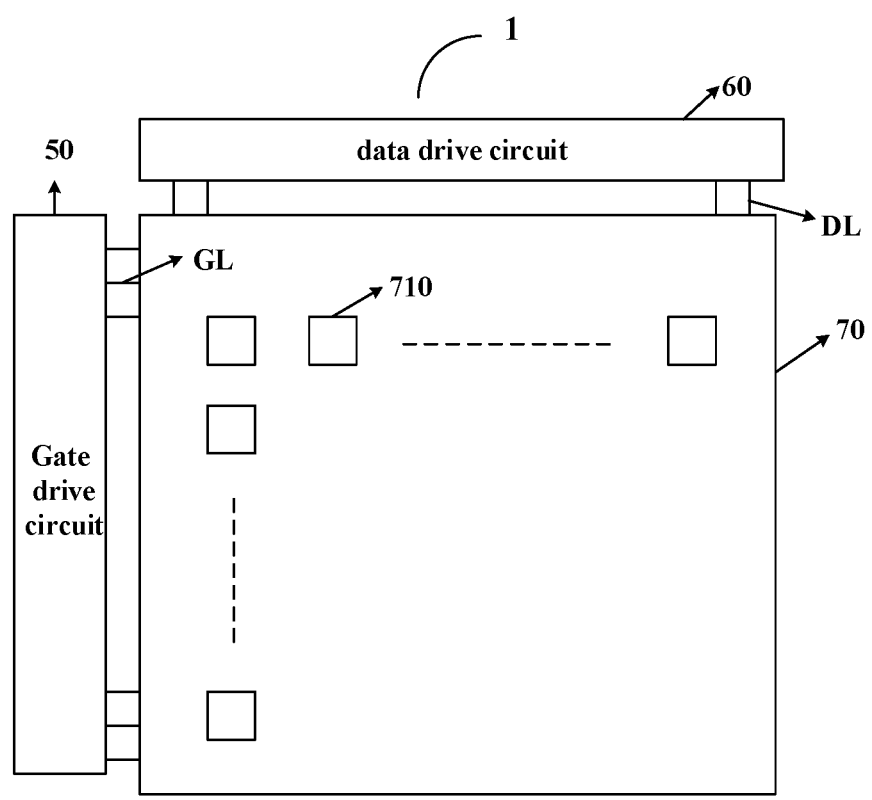
FIG. 9 is a schematic diagram of a display device according to some embodiments of the present disclosure.

Some embodiments of the present disclosure also provide a display device 1 comprising a gate drive circuit 50. As shown in FIG. 9, the display device 1 further comprises a display panel 70, and the display panel 70 comprises an array including a plurality of sub-pixel units 710. For example, a sub-pixel unit 710 may be a pixel circuit comprising a structure of 3T1C, 4T1C, 8T2C, or the like. For example, the display device 1 may further comprise a data drive circuit 60. The data drive circuit 60 is configured to provide data signals to the pixel array; the gate drive circuit 50 is configured to provide driving signals to the pixel array, for example, the driving signals may drive a scan transistor and a sensing transistor in the sub-pixel unit 710. The data drive circuit 60 is electrically connected to the sub-pixel unit 710 through a data line DL, and the gate drive circuit 50 is electrically connected to the sub-pixel unit 710 through a gate line GL.

It should be noted that, the display device 1 of the present embodiment may be: a liquid crystal panel, a liquid crystal television, a monitor, an OLED panel, an OLED television, an electronic paper display device, a mobile phone, a tablet computer, a notebook computer, a digital photo frame, a navigator, or any products or components having a display function. The display device 1 may further comprise other components such as a display panel, which is not limited by the embodiments of the present disclosure.

It should be noted that, for clarity and conciseness, the entire structure of the display device 1 is not provided. In order to achieve the necessary functions of the display device, those skilled in the art can set other structures not shown according to a specific application scenario, and the embodiments of the present disclosure are not limited thereto.

The display device provided by the embodiments of the present disclosure can achieve the OR operation of the first shift register sub-unit and the second shift register sub-unit through the above-mentioned gate drive circuit, is not only simple in structure but also low in cost, and is advantageous for achieving the display design such as low cost, narrow frame, high PPI (pixels per inch, the number of pixels per inch).

Some embodiments of the present disclosure also provides a display screen comprising the above described display device of the present disclosure.

The display screen provided by the embodiments of the present disclosure can achieve the OR operation of the first shift register sub-unit and the second shift register sub-unit through the above-mentioned display device, is not only simple in structure but also low in cost, and is advantageous for achieving low cost, narrow frame, high PPI display.

Some embodiments of the present disclosure also provides a driving method, and the driving method may be used to drive an OR logic operation circuit provided by an embodiment of the present disclosure, for example, in an example, the driving method comprises: in a case where the first control signal and the third control signal are both at a first level, outputting the first level of the output signal at the output terminal; and in a case where at least one of the first control signal and the third control signal is at a second level, outputting the second level of the output signal at the output terminal.

The technical effects of the driving method provided by the embodiments of the present disclosure, may be referred to the corresponding descriptions of the OR logic operation circuit in the above embodiment, and details are not described herein again.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

Although the embodiments of the present disclosure have been shown and described above, it is to be understood that the above-described embodiments are illustrative and are not to be construed as limiting the present disclosure, and changes, modifications, substitutions, and variations of the above-described embodiments may be obtained by those skilled in the art within the scope of the present disclosure.

What is claimed is:

1. A shift register unit, comprising a first shift register sub-unit, a second shift register sub-unit, and an OR logic operation circuit,
wherein the OR logic operation circuit comprises:
a first inverter, wherein the first inverter is configured to invert a first control signal, which is received, to output a second control signal;
a second inverter, wherein the second inverter is configured to invert a third control signal, which is received, to output a fourth control signal;
a first control circuit, wherein the first control circuit is connected to the first inverter, the second inverter, and an output terminal, and is configured to perform first control on a first node and the output terminal to achieve an OR operation, under control of the second control signal and the fourth control signal, and to output a first level of an output signal at the output terminal; and
a second control circuit, wherein the second control circuit is connected to the output terminal, and is configured to perform second control on the first node and the output terminal to output a second level of the output signal at the output terminal,
wherein the first shift register sub-unit is connected to the first inverter of the OR logic operation circuit, and the second shift register sub-unit is connected to the second inverter of the OR logic operation circuit.

2. The shift register unit according to claim 1, wherein the second control circuit comprises:
a first transistor, wherein a first terminal of the first transistor is connected to a control terminal of the first transistor, and is connected to a first voltage terminal to receive a first voltage;
a second transistor, wherein a first terminal of the second transistor is connected to the first voltage terminal to receive the first voltage, a control terminal of the second transistor is connected to a second terminal of the first transistor and the first node; and
a first capacitor, wherein one terminal of the first capacitor is connected to the first node, and another terminal of the first capacitor is connected to a second terminal of the second transistor and the output terminal.

3. The shift register unit according to claim 2, wherein the first control circuit comprises:
a third transistor, wherein a first terminal of the third transistor is connected to the first node, and a control terminal of the third transistor is connected to a third node to receive the fourth control signal;
a fourth transistor, wherein a first terminal of the fourth transistor is connected to a second terminal of the third transistor, a control terminal of the fourth transistor is connected to a second node to receive the second control signal, and a second terminal of the fourth transistor is connected to a second voltage terminal to receive a second voltage;
a fifth transistor, wherein a first terminal of the fifth transistor is connected to the output terminal, and a control terminal of the fifth transistor is connected to the control terminal of the third transistor; and
a sixth transistor, wherein a first terminal of the sixth transistor is connected to a second terminal of the fifth transistor, a control terminal of the sixth transistor is connected to the control terminal of the fourth transistor, and a second terminal of the sixth transistor is connected to the second voltage terminal to receive the second voltage.

4. The shift register unit according to claim 3, wherein the first transistor to the sixth transistor all are depletion mode transistors.

5. The shift register unit according to claim 4, wherein the first inverter comprises:
a seventh transistor, wherein a first terminal of the seventh transistor is connected to a control terminal of the seventh transistor, and is connected to the first voltage terminal to receive the first voltage; and
an eighth transistor, wherein a first terminal of the eighth transistor is connected to a second terminal of the seventh transistor and a second node, a control terminal of the eighth transistor, as an input terminal of the first inverter, receives the first control signal, and a second terminal of the eighth transistor is connected to the second voltage terminal to receive the second voltage,
wherein the second node serves as an output terminal of the first inverter.

6. The shift register unit according to claim 5, wherein the second inverter comprises:
a ninth transistor, wherein a first terminal of the ninth transistor is connected to a control terminal of the ninth transistor, and is connected to the first voltage terminal to receive the first voltage; and
a tenth transistor, wherein a first terminal of the tenth transistor is connected to a second terminal of the ninth transistor and a third node, and a control terminal of the tenth transistor, as an input terminal of the second inverter, receives the third control signal, and a second terminal of the tenth transistor is connected to the second voltage terminal to receive the second voltage,
wherein the third node serves as an output terminal of the second inverter.

7. The shift register unit according to claim 1, wherein the first inverter comprises:
a seventh transistor, wherein a first terminal of the seventh transistor is connected to a control terminal of the seventh transistor, and is connected to a first voltage terminal to receive a first voltage; and
an eighth transistor, wherein a first terminal of the eighth transistor is connected to a second terminal of the seventh transistor and a second node, a control terminal of the eighth transistor, as an input terminal of the first inverter, receives the first control signal, and a second terminal of the eighth transistor is connected to a second voltage terminal to receive a second voltage,
wherein the second node serves as an output terminal of the first inverter.

8. The shift register unit according to claim 1, wherein the second inverter comprises:
a ninth transistor, wherein a first terminal of the ninth transistor is connected to a control terminal of the ninth transistor, and is connected to a first voltage terminal to receive a first voltage; and
a tenth transistor, wherein a first terminal of the tenth transistor is connected to a second terminal of the ninth transistor and a third node, and a control terminal of the tenth transistor, as an input terminal of the second inverter, receives the third control signal, and a second terminal of the tenth transistor is connected to a second voltage terminal to receive a second voltage,
wherein the third node serves as an output terminal of the second inverter.

9. The shift register unit according to claim 1, wherein the first shift register sub-unit comprises a first input circuit, a first output circuit, and a first noise reduction circuit, wherein the first input circuit is connected to a first control node, and is configured to control a level of the first control node, in response to a first input signal, to obtain the first control signal;

the first output circuit is connected to the first control node and a first shift output terminal, and is configured to output a first shift output signal at the first shift output terminal under control of the first control signal; and the first noise reduction circuit is connected to the first control node, a second control node, and the first shift output terminal, and is configured to perform noise reduction on the first shift output terminal and the first control node in response to a level of the second control node.

10. The shift register unit according to claim 9, wherein the first inverter is further configured to control the level of the second control node, in response to the first control signal, to obtain the second control signal.

11. The shift register unit according to claim 9, wherein the first shift register sub-unit further comprises a first inverting circuit, and the first inverting circuit is configured to control the level of the second control node, in response to the first control signal, to obtain the second control signal.

12. The shift register unit according to claim 9, wherein the second shift register sub-unit comprises a second input circuit, a second output circuit, and a second noise reduction circuit, wherein the second input circuit is connected to a third control node, and is configured to control a level of the third control node, in response to a second input signal, to obtain the third control signal;

the second output circuit is connected to the third control node and a second shift output terminal, and is configured to output a second shift output signal at the second shift output terminal under control of the third control signal; and the second noise reduction circuit is connected to the third control node, a fourth control node, and the second shift output terminal, and is configured to perform noise reduction on the second shift output terminal and the third control node in response to a level of the fourth control node.

13. The shift register unit according to claim 12, wherein the second inverter is configured to control the level of the fourth control node, in response to the third control signal, to obtain the fourth control signal.

14. The shift register unit according to claim 12, wherein the second shift register sub-unit further comprises a second inverting circuit, and the second inverting circuit is configured to control the level of the fourth control node, in response to the third control signal, to obtain the fourth control signal.

15. A gate drive circuit, comprising a plurality of cascaded shift register units according to claim 1.

16. The gate drive circuit according to claim 15, further comprising a first gate drive sub-circuit and a second gate drive sub-circuit, wherein the first gate drive sub-circuit comprises a plurality of cascaded first shift register sub-units, and the second gate drive sub-circuit comprises a plurality of cascaded second shift register sub-units.

17. The gate drive circuit according to claim 16, wherein except for a first stage of first shift register sub-unit, a first input terminal of each stage of first shift register sub-unit other than the first stage of first shift register sub-unit is connected to a first shift output terminal of a previous stage of first shift register sub-unit; and except for a first stage of second shift register sub-unit, a second input terminal of each stage of second shift register sub-unit other than the first stage of second shift register sub-unit is connected to a second shift output terminal of a previous stage of second shift register sub-unit.

18. A display device, comprising the gate drive circuit according to claim 15.

19. A driving method of the OR logic operation circuit in the shift register unit according to claim 1, comprising:

in a case where the first control signal and the third control signal are both at a first level, outputting the first level of the output signal at the output terminal; and in a case where at least one of the first control signal and the third control signal is at a second level, outputting the second level of the output signal at the output terminal.

* * * * *